United States Patent [19]
Anderson et al.

[11] Patent Number: 5,338,507
[45] Date of Patent: * Aug. 16, 1994

[54] SILVER ADDITIVES FOR CERAMIC SUPERCONDUCTORS

[75] Inventors: John T. Anderson, Woodside; V. K. Nagesh, Cupertino; Richard C. Ruby, Menlo Park, all of Calif.

[73] Assignee: Hewlett-Packard Company, Palo Alto, Calif.

[ * ] Notice: The portion of the term of this patent subsequent to Dec. 10, 2008 has been disclaimed.

[21] Appl. No.: 751,463

[22] Filed: Aug. 29, 1991

Related U.S. Application Data

[60] Division of Ser. No. 423,511, Oct. 13, 1989, Pat. No. 5,071,826, which is a continuation of Ser. No. 74,799, Jul. 17, 1987, abandoned, which is a continuation-in-part of Ser. No. 32,414, Mar. 30, 1987, abandoned.

[51] Int. Cl.$^5$ .............................. B22F 3/10; B22F 3/16
[52] U.S. Cl. ........................................ 505/470; 419/21; 419/30; 419/35; 419/38; 419/47; 505/471; 505/500; 505/124
[58] Field of Search ................. 505/1; 419/21, 54, 23, 419/30, 35, 38, 47

[56] References Cited

U.S. PATENT DOCUMENTS

| | | | |
|---|---|---|---|
| 4,826,808 | 5/1989 | Yurek et al. | 505/1 |
| 4,988,673 | 1/1991 | Ferrando | 505/1 |
| 4,999,398 | 3/1991 | Wijeyesekera et al. | 505/1 |
| 5,071,826 | 12/1991 | Anderson et al. | 505/1 |
| 5,082,688 | 6/1992 | Agostinelli et al. | 427/126.3 |
| 5,082,826 | 1/1992 | Ferrando | 505/1 |
| 5,091,362 | 2/1992 | Ferrando | 505/1 |
| 5,118,662 | 6/1992 | Agostinelli et al. | 505/1 |
| 5,118,663 | 6/1992 | Wolf et al. | 505/1 |

Primary Examiner—Donald P. Walsh
Assistant Examiner—Daniel Jenkins

[57] ABSTRACT

A method for making metal/ceramic superconductor thick film structures including the steps of preparing a silver/superconductor ink, applying the ink to a substrate, evaporating the ink's binder, decomposing a silver compound in the residue to coat the superconductor grains, sintering the coated superconductor grains, and oxygenating the superconductor grains through the silver coating. The resultant inter-granular silver increases the critical current and mechanical strength of the superconductor.

14 Claims, No Drawings

SILVER ADDITIVES FOR CERAMIC SUPERCONDUCTORS

CROSS-REFERENCE TO RELATED APPLICATIONS

This is a divisional of copending application Ser. No. 07/423,511 filed on Oct. 13, 1989, U.S. Pat. No. 5,071,826 which is a continuation of application Ser. No. 07/074,799 filed on Jul. 17, 1987, abandoned, which is a continuation-in-part of application Ser. No. 07/032,414 filed on Mar. 30, 1987, abandoned, on behalf of Richard C. Ruby, V. K. Nagesh, and John T. Anderson, and entitled "Superconductor Inks, Thick Film Structures, and Methods for Making Same."

DESCRIPTION

1. Technical Field

This invention relates generally to superconductors, and more particularly to methods for making superconducting thick film structures.

2. Background Art

The phenomenon of superconductivity was discovered by K. H. Onnes in 1911 when he demonstrated that the electrical resistance of mercury drops to zero when it is cooled to approximately 4 Kelvin (K.). For many years the phenomenon of superconductivity remained a scientific curiosity, with few practical applications.

On Mar. 2, 1987, M. K. Wu et al. published a paper entitled "Superconductivity at 93 K. in a New Mixed-Phase Y-Ba-Cu-O Compound System at Ambient Pressure" in Physical Review Letters, Volume 58, Number 9. This announcement caused considerable excitement in the scientific and business communities because, for the first time, a superconductor material had been discovered which could use liquid nitrogen as a coolant. Since liquid nitrogen cooling systems are at least an order of magnitude less expensive than liquid helium cooling systems, many applications for superconductors suddenly became practical after Wu's discovery.

Standard processing of YBaCuO superconductor, as reported in the literature, results in a multi-crystalline solid comprising numerous, sintered-together superconducting grains. Measurements by many researchers in the field have indicated that the critical current (i.e. the maximum superconducting current of a material) that can be carried by this multi-crystalline structure is typically in the vicinity of $10^3$ amperes/cm$^2$. This contrasts with a critical current of approximately $10^5$ amperes/cm$^2$ in single crystal YBaCuO. Unfortunately, single crystals of this superconducting substance have, to date, only been made as thin-films or as crystallites having maximum dimensions of only a few millimeters.

Because the critical current in multi-crystalline YBaCuO is approximately two orders of magnitude less than the critical current in single crystal YBaCuO, it appears that the individual superconducting grains are insulated from each other. The insulation may result from inter-granular contamination, or may simply be empty space between the grains. In either event, the superconducting current must tunnel through the insulation between the superconducting grains, thus drastically reducing the critical current in multi-crystalline YBaCuO.

DISCLOSURE OF THE INVENTION

An object of this invention is to increase the magnitude of the critical current for multi-crystalline ceramic superconductor materials.

Another object of this invention is to improve the mechanical properties of multi-crystalline ceramic superconductor materials.

Briefly, the invention comprises the addition of silver into the inter-granular matrix of multi-crystalline ceramic superconductor materials. For example, to make a silver/superconductor ink, a solution of a silver compound (typically toluene) is added to powdered, bulk superconductor and then mixed into a suitable binder. The ink is then applied to a substrate and heated to drive off the binder and to decompose the silver compound. Next, the substrate is heated to sinter the superconductor grains (which have been wetted by the silver), and is finally annealed in an oxygen environment to optimize the oxygen content of the superconductor.

An advantage of this invention is that the inter-granular silver is highly conductive, thereby greatly enhancing the connectivity between the grains of superconductor and thus increasing the critical current of the superconducting ink or bulk material.

Another advantage of this invention is that the silver mechanically improves the ceramic superconductor material by increasing its strength and workability.

These and other objects and advantages will become apparent to those skilled in the art upon a reading of the following detailed descriptions.

BEST MODE FOR CARRYING OUT THE INVENTION

The preferred embodiments of the present invention will be discussed in terms of the new YBaCuO class of high temperature superconductors that were discovered by Wu, supra. However, it should be apparent to those skilled in the art that the methods and structures described herein could be practiced with a wide variety of ceramic superconducting materials, many of which are yet to be discovered.

In the prior art, YBaCuO samples are prepared from mixtures of high purity $Y_2O_3$, $BaCO_3$, and $CuO$ powders. The powders are mixed in a solvent, such as methanol or water, and subsequently heated to 100° C. to evaporate the solvent. The resultant mixture is then heated for six hours in air at 850° C. to produce a dark, green powder. The green powder is then heated for an additional six hours at 950° C. to become a black, porous solid. The result is a multi-crystalline bulk material generally characterized as $Y_1Ba_2Cu_3O_{6.5-7}$. A detailed explanation of the method steps involved in the manufacture of superconducting YBaCuO and a description of some of its properties can be found in a paper entitled "Superconductivity and Magnetism in High-$T_C$ Superconductor YBaCuO", J. Z. Sun, et al., Department of Applied Physics, Stanford University, PACS #: 74.30.-E, 74.70.-B.

The selection of silver as an inter-granular constituent is based upon several properties of the metal including:
1) Silver does not form stable oxides in the processing range of 500°–970° C. used for the YBaCuO superconductor, and thus will not compete with those materials for oxygen;
2) Silver has a high permeability to oxygen at elevated temperatures, thereby allowing oxygen annealing of the superconductor materials despite a silver coating on the particles;

3) Silver has a high conduction electron density, which greatly enhances the strength of the superconducting paired electrons in the silver vis-a-vis poorer conductors and/or an oxide; and 4) Silver does not react with the YBaCuO class of superconductors and, therefore, will not degrade the superconductor and will remain in its inter-granular position.

The dimensions of the inter-granular silver are preferably less than 0.1 microns. If the thickness of the silver is too large, the resultant material may no longer be a high-temperature superconductor, while if the silver is too thin interstices may form between the grains. Silver coatings of the desired thickness can be achieved by pyrolysis of an organometallic silver compound, such as silver neodecanoate, silver mercaptide, and silver resinate.

EXAMPLE 1

Silver/Superconductor Thick Film Structures

Many thick film structures can be made from a silver/superconductor ink of the present invention. For example, silver/superconductor ink can be used to make integrated circuit interconnects in multi-layer ceramic structures, delay lines, strip lines, convolvers, etc.

A process for making a superconducting device from such an ink is as follows:

1) Prepare a ceramic superconductor by any of a variety of known methods;
2) Powder the ceramic superconductor to the particle size suitable for an ink (preferably less than 1-5 microns);
3) Compound the superconductor with the additives necessary for an ink (an organic carrier such as ethyl cellulose in terpineol is suitable) and include sufficient quantities of a silver compound (such as silver neodecanoate in toluene) to cover the superconductor particles with metallic silver approximately 0.05 microns thick;
4) Apply the ink to a suitable substrate in a desired pattern;
5) Air dry the ink to evaporate the binder and solvent;
6) Heat the substrate bearing the dried ink to approximately 300° C. to decompose the silver compound;
7) Raise the temperature of the substrate to approximately 600°-800° C. to sinter the superconductor matrix;
8) Reduce the temperature to approximately 500° C. in a one-atmosphere oxygen oven for approximately 20 hours to optimize the oxygen content of the superconductor; and
9) Cool the substrate below 77° K. to cause the silver/superconductor material to become superconducting.

EXAMPLE 2

Alternative Method for Making Silver/Superconductor Thick Film Structures

Example 2 differs from Example 1 only in the method for making the superconductor ink, which includes the steps of:

1) Preparing a ceramic superconductor by any of a variety of known methods;
2) Powdering the ceramic superconductor to a particle size suitable for an ink (preferably less than 1-5 microns);
3) Mixing the powdered superconductor with a solution of a silver compound (such as silver neodecanoate in toluene) in sufficient quantity to cover the superconductor particles with metallic silver approximately 0.05 microns thick;
4) Heating the mixture to approximately 100° to drive away the solvent;
5) Heating the mixture to approximately 300° C. to decompose the silver compound; and
6) Compounding the silver coated superconductor with additives (such as ethyl cellulose in terpineol) to make an ink.

The remainder of the method for making silver/superconductor thick film structures in this second example is the same as in Example 1 starting with step 4, except that step 6 of Example 1 can be skipped.

EXAMPLE 3

Method for Making Bulk Silver/Superconductor

Bulk silver/superconductor can be used as diamagnetic bearings, resonant radio frequency cavities, etc. A process for making bulk silver/superconductor is as follows:

1) Prepare a ceramic superconductor by any of a variety of known methods;
2) Powder the ceramic superconductor to a particle size of approximately 5 microns;
3) Add sufficient quantities of a silver compound in solution to cover the superconductor particles with metallic silver approximately 0.05 microns thick;
4) Heat the silver/superconductor to approximately 100° C. to drive off the solvent of the silver compound;
5) Compact the silver/superconductor under a pressure of approximately 10,000 p.s.i.;
6) Raise the substrate to approximately 500°-600° C. to sinter the superconductor matrix;
7) Reduce the temperature to approximately 500° C. in a one-atmosphere oxygen oven for approximately 20 hours to optimize the oxygen content of the superconductor; and
8) Cool the substrate below 77° K. to cause the silver/superconductor material to become superconducting.

The silver additive, whether for inks, thick films, thin films, wires, bulk materials, etc. will give the material a higher critical current and a sharper superconducting transition. Furthermore, the silver additive tends to cement the superconductor particles together, adding mechanical strength to the somewhat fragile ceramic. Also, the silver additive permits better adhesion of the superconductor material to substrates and to electrical contacts.

For applications in which very high electrical conductivity is satisfactory rather than true superconductivity, a silver conductor containing superconducting grains will have its conductivity improved by at least the volumetric fraction of the included superconductor grains. Also, the silver coating implicit in this invention allows electrical contact to be made to a superconductor material by conventional soldering or simple pressure pads.

While this invention has been described in terms of several preferred embodiments, it is intended that the true spirit and scope of the present invention be interpreted in terms of the following appended claims.

What is claimed is:

1. A method for making a superconductor material comprising the steps of:

firstly producing a multitude of copper-oxide based superconductor grains;

secondly mixing a material comprising silver with said superconductor grains; and thirdly heating said mixture of said superconductor grains and said material comprising silver to cause intergranular silver to electrically contact said superconductor grains.

2. A method as recited in claim 1 wherein said material is a compound of silver and wherein said step of heating said mixture decomposes said compound to provide elemental silver for contacting said grains.

3. A method as recited in claim 1 wherein said material comprises elemental silver.

4. A method as recited in claim 1 further comprising an additional heating step to sinter said superconductor grains.

5. A method as recited in claim 1 further comprising an additional heating step in the presence of oxygen such that oxygen may diffuse through said silver to said superconductor grains.

6. A method for making a superconductor material comprising:

producing a copper-oxide based superconductor;

powdering said superconductor to create a plurality of particles;

combining said powdered superconductor with a silver material;

compacting said combination of said powdered superconductor and said silver material to form a cohesive structure; and heating said structure to sinter said particles of superconductor.

7. A method for making a superconductor material as recited in claim 6 further comprising the step of:

heating said structure in the presence of oxygen.

8. A method as recited in claim 7 wherein said step of heating said structure in the presence of oxygen is accomplished in a one-atmosphere oxygen oven at a temperature of about 500° C.

9. A method as recited in claim 6 wherein said particles have an average size of no more than about 5 microns.

10. A method as recited in claim 9 wherein
    sufficient silver material is added to coat said particles with silver of about 0.05 microns in thickness.

11. A method as recited in claim 6 wherein said silver material includes a volatile liquid, and further comprising the step of heating said combination to evaporate said volatile liquid.

12. A method as recited in claim 11 wherein said combination is heated to about 100° C. to evaporate said volatile liquid.

13. A method as recited in claim 6 wherein said combination is compacted at a pressure of at least about 10,000 p.s.i.

14. A method as recited in claim 6 wherein said step of heating said structure to sinter said particles is accomplished at about 500°–600° C.

* * * * *